June 28, 1960 F. A. HILL ET AL 2,943,212

DIRECT COUPLED TRANSISTOR CIRCUIT

Filed Feb. 13, 1956

INVENTORS
FRANK A. HILL
A.J. PANKRATZ

BY Theodore H. Lassagne

ATTORNEY

United States Patent Office 2,943,212

Patented June 28, 1960

2,943,212

DIRECT COUPLED TRANSISTOR CIRCUIT

Frank A. Hill, Van Nuys, and A. J. Pankratz, Glendale, Calif., assignors to General Precision, Inc., a corporation of Delaware Filed Feb. 13, 1956, Ser. No. 564,993

12 Claims. (Cl. 307—88.5)

This invention relates to multivibrators and more particularly to multivibrators using semi-conductors such as transistors. The invention is especially concerned with circuits in which semi-conductors such as transistors are directly coupled to one another.

Since the development of transistors a few years ago, circuits have been developed to use the transistors in a number of different ways. The use of transistors in electronic circuits is advantageous since the transistors have a relatively small size. Other advantages result from the low dissipation of power in the transistors and from the stable operating characteristics of the transistors over long periods of time.

Many circuits employ two or more transistors to produce a desired result. One way of connecting the transistors is by direct coupling such that certain elements in each transistor are directly connected to particular elements in other transistors in accordance with the electronic functions being performed. The direct coupling of transistors is advantageous since the circuitry is relatively simple. For example, because of the direct coupling of the transistors, no impedances have to be connected between the transistors. This minimizes energy losses in the circuits and causes low impedances to be presented by each stage to the successive stages in the circuits. The low impedances are desirable since they minimize energy losses when each stage is used as a signal generator for the next stage.

This invention provides circuits which include semi-conductors such as transistors directly coupled to one another to perform various types of multivibrator functions. The circuitry constituting this invention includes an inductance connected between the collectors of a pair of transistors to control the operation of the circuits in performing multivibrator functions. In one embodiment of the invention, the inductance is connected directly between the collectors of the transistors to produce a free running multivibrator. This type of multivibrator produces signals such as clock signals on a cyclic basis. A resistance having a relatively small value may also be in series with the inductance without affecting the operation of the circuit in producing alternating signals.

In another embodiment of the invention, a resistance having an intermediate value is in series with the inductance. This embodiment uses the transistors, the inductance and the resistance to produce a bistable multivibrator having a relatively fast response to the introduction of input signals. This type of multivibrator changes from a first state of operation to a second state of operation instantaneously after the introduction of a triggering signal to the multivibrator. The quick response of the multivibrator results at least in part from the inclusion of the inductance.

The transistors and the inductance are included in a third embodiment of the invention to perform functions corresponding to those of a monostable multivibrator. This type of multivibrator has the characteristics of changing from a first state of operation to a second state of operation upon the introduction of a triggering signal. The multivibrator automatically changes back to the first state of operation after a particular time. The time required for the multivibrator to change back to the first state of operation after being triggered to the second state of operation is dependent in part upon the value of the inductance.

Figure 1:
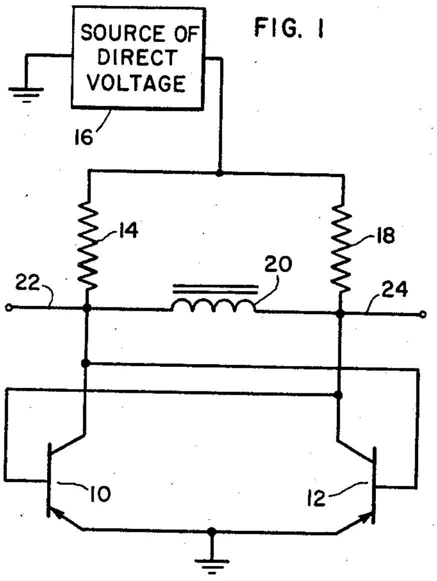
Figure 1 is a circuit diagram somewhat schematically illustrating stages including a pair of directly coupled transistors and an inductance for operating in a manner similar to a free running multivibrator to produce alternating clock signals.

In the embodiment of the invention shown in Figure 1, a pair of semi-conductors such as transistors 10 and 12 are directly coupled to each other. Each of the transistors 10 and 12 may include elements equivalent to or corresponding to a base, an emitter and a collector. The transistors 10 and 12 may be of the type in which a foreign substance such as indium or a mixture of indium and gallium is coated on a germanium base. The bases of the transistors 10 and 12 may be provided with a pair of parallel flat faces separated from each other by a relatively thin width. The coatings of foreign material may be formed on the parallel faces of the germanium base to serve as the emitter and the collector for each of the transistors 10 and 12. Transistors of this type found useful in the circuits constituting this invention include type "SB–100" manufactured by the Philco Corporation, type "RR–115" manufactured by Radio Receptor Company, types "OC–32" "OC–33" and "OC–34" manufactured by Transistor Products, and type "ZJ–11" manufactured by the General Electric Corporation. The transistors manufactured by Philco are of the surface barrier type.

The emitters of the transistors 10 and 12 may be directly grounded. The base of each transistor is connected to the collector of the other transistor to provide a direct coupling between the transistors. Because of this, it will be understood that the term "directly connected" in the claims indicates that there is no impedance between the collector of each of the transistors 10 and 12 and the base of the other transistor. The collector of the transistor 10 is also connected to one terminal of a resistance 14 having a suitable value such as approximately 1000 ohms. The other terminal of the resistance 14 is connected to a voltage source indicated in block form at 16. The source 16 is adapted to provide a suitable direct voltage having a negative polarity and a relatively low amplitude such as approximately 1.5 volts.

In like manner, a resistance 18 is connected between the collector of the transistor 12 and the negative terminal of the voltage source 16. The resistance 18 may have a value corresponding to the value of the resistance 14. A reactance member such as an inductance 20 is connected between the collectors of the transistors 10 and 12. The inductance 20 may have a suitable value such as approximately 60 microhenrys. Output lines 22 and 24 are also respectively connected to the collectors of the transistors 10 and 12.

Figure 4:
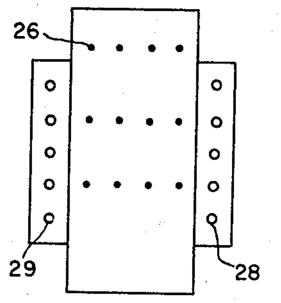
Figure 4 is a diagram somewhat schematically illustrating the operation of semi-conductors such as transistors included in the previous figures.

The transistor 10 and 12 are of the PNP type. In this type of transistor, the end portions of the transistor have an excess of positive charges or "holes" and the middle portion has an excess of electrons. The excess of electrons in the middle portion or base is represented in Figure 4 by solid circles 26 and the excesses of holes in the end portions corresponding to the collector and emitter are respectively represented by hollow circles 28 and 29. When a negative voltage is applied to the base of each transistor relative to the voltage on the emitter of the transistor, the positive charges or holes in the emitter are attracted toward the base. If the attractive force is sufficiently great, most of the positive charges continue through the base toward the collector. This action is facilitated by applying a negative voltage on the collector relative to the voltage on the base such that the collector acts to attract the positive charges travelling from the emitter toward the base.

The holes may be considered as passing initially from the emitter to the collector of the transistor 10 to produce a flow of current through the transistor. This causes current to flow through a circuit including the emitter and collector of the transistor 10, the resistance 14 and the voltage source 16. When current flows through the transistor 10, a relatively low impedance is produced in the transistor. This causes a relatively small voltage drop to be produced between the emitter and collector of the transistor 10. Since a relatively small voltage drop is produced between the emitter and the collector of the transistor 10, the collector can be considered as having a potential approaching that of the emitter. For this reason, the collector of the transistor 10 may be considered as having a potential approaching ground.

The ground potential on the collector of the transistor 10 is applied to the base of the transistor 12. Since the emitter of the transistor 12 is also at ground potential, no voltage is applied between the base and emitter of the transistor. This prevents any of the holes in the emitter of the transistor 12 from being attracted toward the base of the transistor. Because of this, no current is able to flow through the transistor 12. Since the transistor 12 is cut off, current cannot flow through a circuit including the transistor, the resistance 18 and the voltage source 16. However, current does flow through a circuit including the emitter and the base of the transistor 10, the resistance 18 and the voltage source 16. The impedance between the emitter and the base of the transistor 10 during the flow of current through the transistor is of such a value that the voltage between these elements is limited to a value of approximately 0.25 volt. This causes a similar potential to be produced on the collector of the transistor 12.

As will be seen from the above discussion, a negative potential is produced on the output line 24 and ground potential is produced on the output line 22. This causes a voltage difference to be produced across the inductance 20. Because of this voltage difference, current flows through a circuit including the transistor 10, the inductance 20, the resistance 18 and the voltage source 16. As the current flows through the inductance 20, the inductance becomes progressively saturated. This causes the impedance of the inductance to decrease with a continued flow of current through the inductance. Because of the decrease in the impedance of the inductance 20, the potential difference across the inductance gradually decreases.

As the voltage difference across the inductance 20 decreases, the voltages on the collector of the transistor 10 and on the base of the transistor 12 gradually become negative because the voltage on the base of the transistor 10 approaches ground. When the voltage on the base of the transistor 12 has decreased to a negative value approaching —.2 volt, a sufficient voltage difference is produced between the emitter and the base of the transistor 12 to initiate a flow of current through the transistor. This current flows through a circuit including the transistor 12, the resistance 18 and the voltage source 16. The current flowing through the transistor 12 causes the potential on the collector of the transistor to approach the ground potential on the emitter of the transistor. Since the potential on the collector of the transistor 12 is introduced to the base of the transistor 10, the current through the transistor 10 starts to decrease when a flow of current through the transistor 12 is initiated.

The decrease in the flow of current through the transistor 10 causes a negative potential to be produced on the collector of the transistor. This negative potential is introduced to the base of the transistor 12 to produce an increased flow of current through the transistor. In this way, the transistors 10 and 12 cooperate to completely cut off the transistor 10 and to produce a full flow of current through the transistor 12.

When a full flow of current is obtained through the transistor 12, the collector of the transistor is provided with a potential approaching the ground potential on the emitter of the transistor. At this time, a negative potential is produced on the collector of the transistor 10 since current cannot flow through a circuit including the transistor, the resistance 14 and the voltage source 16. These differences in potential on the collectors of the transistors 10 and 12 cause a voltage difference to be produced across the inductance 20. This voltage difference produces a flow of current through the inductance.

As the current flows through the inductance 20, the inductance tends to become saturated and the impedance of the inductance becomes reduced. This causes the potential on the collector of the transistor 12 and on the base of the transistor 10 to become negative. Because of the negative potential on the base of the transistor 10, a current flow is initiated through the transistor. When a flow of current through the transistor 10 is initiated, the current through the transistor 12 becomes reduced. The reduction in current through the transistor 12 in turn acts to produce an increased flow of current through the transistor 10. In this way, current of full amplitude eventually flows through the transistor 10 and the transistor 12 eventually becomes completely non-conductive.

It will be seen from the previous discussion that the circuit shown in Figure 1 acts as a free running multivibrator to produce current flow alternately through the transistors 10 and 12. In this way, alternate signals of ground potential and of a negative potential are produced on the output lines 22 and 24. A signal of ground potential is produced on the output line 22 when a signal of negative potential is produced on the output line 24. Similarly, a signal of ground potential is produced on the output line 24 upon the production of a signal of negative potential on the output line 22. The signals are produced at a constant frequency such that the circuit can serve as a clock generator in digital computers and data processing systems.

The frequency of signals produced by the free running multivibrator shown in Figure 1 is dependent in part upon the values of certain parameters. For example, the frequency is dependent at least in part upon the value of the inductance 20. When the value of the inductance 20 is decreased, the frequency of the signals increases. This results from the fact that the inductance 20 can become more easily responsive to a flow of current through the inductance so as to initiate relatively quickly a flow of current through the non-conductive transistor. In like manner, the frequency of the signals decreases as the value of the inductance increases.

The frequency of the signals produced by the free running multivibrator shown in Figure 1 is also dependent upon the values of the resistances 14 and 18. For example, when the values of the resistances 14 and 18 are decreased, the amplitudes of the currents flowing through the transistors 10 and 12 increase. Because of the increased flow of current through the transistors, an increased time is required to cut off the conductive transistor and to produce a full flow of current through the non-conductive transistor. In this way, the frequency of the signals becomes reduced. In like manner, the frequency of the signals becomes increased when the values of the resistances 14 and 18 are increased.

It should be appreciated that the resistances 14 and 18 do not necessarily have to be of equal values. When the resistances 14 and 18 have unequal values, cyclic signals are produced at a particular frequency. In each cycle of operation, however, one of the transistors remains conductive for a longer period of time than the other transistor. This causes the circuit shown in Figure 1 to be free running on an unbalanced basis.

The circuit shown in Figure 1 and described above has certain important advantages. It uses a pair of transistors which are directly coupled to each other to produce a free running multivibrator. By coupling the transistors 10 and 12 directly to each other, power losses in the free running multivibrator are minimized. The power losses are also minimized by using the inductance 20 as a control member since energy losses cannot occur in an inductance. Furthermore, the impedances of the stages can be held to a relatively low value so that the stages can be easily coupled to successive stages. The circuit is also advantageous in that it occupies a relatively small amount of space. This results in part from the use of transistors and in part from the use of a minimum number of components. The circuit is further advantageous in that it can be easily formed electrically on a connector board such as that disclosed and claimed in co-pending application, Serial No. 569,341, filed March 5, 1956, by Frank A. Hill et al.

The above discussion has proceeded on the basis of having no resistance or a relatively small resistance in series with the inductance 20 between the collectors of the transistors 10 and 12. At the other extreme, a resistance of infinite resistance may be connected in series with the inductance 20 between the collectors of the transistors 10 and 12. Under such a condition, the branch between the collectors of the transistors 10 and 12 may be considered as open and the inductance 20 may be considered as having no effect. Because of this open circuit, the circuit would operate as a bistable multivibrator having a first state of operation and a second state of operation. The bistable multivibrator would be triggered to its first state of operation upon the introduction of triggering signals to the base of the transistor 10. Similarly, the bistable member would be triggered to its second state of operation when signals are introduced to the transistor 12. The operation of the circuit as a bistable multivibrator would be similar to that described in detail in co-pending application, Serial No. 565,093, filed by Frank A. Hill et al. on February 13, 1956.

Different results are obtained when a resistance of intermediate value is connected in series with the inductance 20 between the collectors of the transistors 10 and 12. This resistance is illustrated at 30 in Figure 2 and may be provided with an intermediate value between zero and infinity such as a value of approximately 500 ohms. In order to understand the operation of the circuit shown in Figure 2, the transistor 12 may be considered as initially conductive and the transistor 10 may be considered as initially non-conductive.

Since the transistor 12 is initially conductive, current flows through a circuit including the transistor, the resistance 18 and the voltage source 16. Because of this current flow, the voltage on the collector of the transistor approaches the ground potential on the emitter of the transistor. This potential is introduced to the base of the transistor 10 to maintain the transistor non-conductive. Since the transistor 10 is cut off, a negative potential approaching −0.025 volt is produced on the collector of the transistor and on the base of the transistor 12. This results from the flow of current between the emitter and the base of the transistor 12 in a manner similar to that described above in connection with the embodiment shown in Figure 1.

As described in the previous paragraph, the collector of the transistor 12 is at a potential approximating ground and the collector of the transistor 10 is at a negative potential. Because of this difference in potential, current flows through the inductance 20 and the resistance 30. The current has a limited amplitude because of the fairly large value provided for the resistance 30. Since the current through the inductance 20 is relatively low, the inductance cannot operate by changes in its impedance to produce an alternate flow of current through the transistors 10 and 12 for the production of clock signals. For this reason, any change in conductivity between the transistors 10 and 12 is dependent upon the introduction of input signals to the transistors.

Upon the introduction of a positive signal to the base of the transistor 12, the potential on the base becomes positive with respect to the ground potential on the emitter of the transistor. This tends to cut off any flow of current through the transistor 12. As the current through the transistor 12 becomes interrupted, the potential on the collector of the transistor becomes negative. This negative potential is introduced to the base of the transistor 10 to make the transistor conductive.

The transistor 12 becomes completely cut off immediately upon the introduction of the triggering signal to the base of the transistor. The reason for this is that the inductance 20 acts to aid any change in the potentials on the collectors of the transistors 10 and 12 when a triggering signal is introduced to the base of the transistor 12. For this reason, the triggering of the transistor 12 to a state of non-conductivity and of the transistor 10 to a state of conductivity occurs rapidly with the introduction of an input signal to the base of the transistor 12. The input signal introduced to the base of the transistor 12 can have a relatively small amplitude since the action of the input signal is aided by the operation of the inductance 20.

When the transistor 12 becomes cut off and the transistor 10 becomes conductive, the collector of the transistor 10 is at ground potential and the collector of the transistor 12 is at a negative potential. This potential difference causes current to flow through the inductance 20 and the resistance 30. Because of the fairly high value of the resistance 30, the current flowing through the inductance 20 is relatively low and cannot produce any appreciable changes in the impedance of the branch formed by the inductance 20 and the resistance 30. For this reason, the inductance cannot operate to trigger the transistor 12 back to a state of conductivity and the transistor 10 back to a state of non-conductivity.

The transistor 12 can be triggered to a state of conductivity and the transistor 10 can be triggered to a state of non-conductivity only by the introduction of an external signal. The time required to trigger the transistors 10 and 12 is shortened as a result of the operation of the inductance 20. Certain other advantages result from the inclusion of the inductance 20. One of these advantages is that the ampitude of the input signals required to trigger the circuit can be reduced in a manner similar to that described above by including the inductance 20. Furthermore, the output from the collectors of the transistors 10 and 12 is increased because of the kick provided by the inductance 20 when an input signal is introduced to the circuit. This is important when the circuit shown in Figure 2 is connected to subsequent stages to trigger the stages in accordance with the operation of the circuit.

Figure 2:
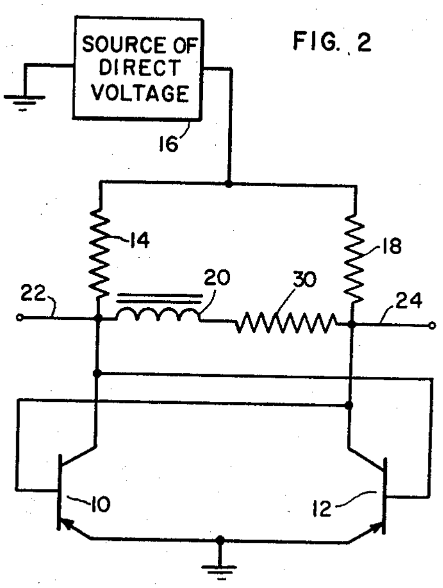
Figure 2 is a circuit diagram somewhat schematically illustrating another embodiment of the invention for operating in a manner similar to a bistable multivibrator to produce responses faster than those normally obtained from bistable multivibrators.

By including the inductance 20, the circuit shown in Figure 2 becomes insensitive for a relatively short time to any further signals after the introduction of a first signal.

This results from the fact that the energy built up in the inductance 20 upon the introduction of the first signal has to discharge from the inductance before the circuit shown in Figure 2 can become responsive to new input signals. In this way, the circuit shown in Figure 2 cannot become triggered by spurious signals such as noise signals which may occur immediately after the introduction of an input signal. The circuit shown in Figure 2 also cannot become triggered by overshoots which may exist in the input signals.

Figure 3:
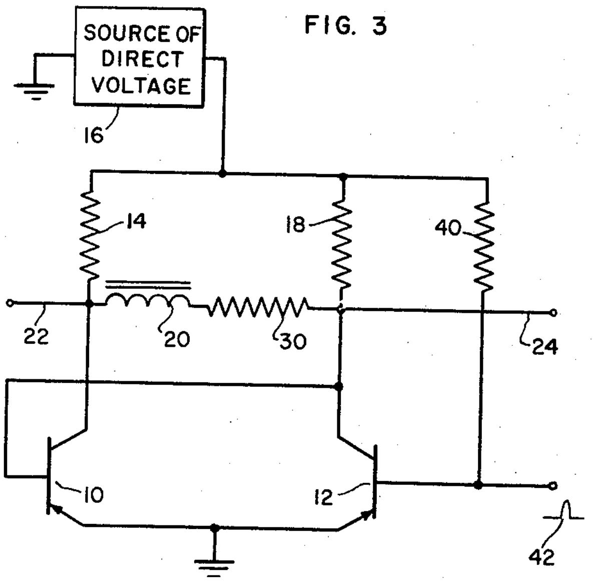
Figure 3 is a circuit diagram somewhat schematically illustrating a third embodiment of the invention for operating in a manner similar to a monostable multivibrator to change from a first state of operation to a second state of operation and then back to the first state a delayed period of time after the introduction of input signal.

The embodiment shown in Figure 3 is somewhat similar to the circuit shown in Figure 2 and described fully above. The embodiment shown in Figure 3 includes the transistors 10 and 12, the resistances 14 and 18 and the inductance 20 as in the previous embodiments. These members are connected to one another in a manner similar to that described above for the embodiment shown in Figure 2 except for a few important changes. These changes include the addition of a resistance 40, which is connected between the base of the transistor 12 and the negative terminal of the voltage source 16. Furthermore, no connection is made between the base of the transistor 12 and the collector of the transistor 10.

The transistor 12 in Figure 3 may be considered as normally conductive and the transistor 10 may be considered as normally nonconductive. When a positive signal schematically indicated at 42 in Figure 3 is introduced to the base of the transistor 12, the voltage on the base of the transistor goes positive and approaches the ground potential on the emitter of the transistor. This causes the base of the transistor 12 to repel the positive charges in the emitter so as to prevent any positive charges from flowing to the collector of the transistor. In this way, the current through the transistor 12 in Figure 3 becomes interrupted.

When the transistor 12 becomes cut off, current cannot flow thourgh a circuit including the transistor 12, the resistance 18 and the voltage source 16. This causes the voltage on the collector of the transistor 12 to become negative. This negative potential is introduced to the base of the transistor 10 to make the transistor conductive. When the transistor 10 becomes conductive, current flows through a circuit including the transistor, the resistance 14 and the voltage source 16.

Upon a flow of current through the transistor 12, the potential on the collector of the transistor approaches the ground potential on the emitter of the transistor. As will be seen, a voltage difference is produced across the inductance 20 since the collector of the transistor 10 is at approximately ground potential and the collector of the transistor 12 is at a negative potential. Because of this potential difference, current flows through the inductance 20 and the resistance 30.

As the current flows through the inductance 20, the impedance of the inductance tends to become lowered in a manner similar to that described above. Since the impendance of the inductance 20 becomes gradually lowered, the voltage difference across the inductance 20 gradually decreases. However, only a current of moderate amplitude is able to flow through the inductance and the resistance 30 since the resistance has a fairly high value. As described previously, the amplitude of this current is below the level necessary to reduce the voltage across the inductance 20 to an amplitude for initiating a flow of current through the transistor 12.

Because of the inclusion of the resistance 40, a negative voltage is introduced to the base of the transistor 12 from the voltage source 16. This voltage acts to make the transistor 12 conductive. However, since only one of the transistors 10 and 12 can be conductive at any one time, the flow of current through the transistor 10 prevents current from immediately flowing through the transistor 12. This is certainly true while the voltage difference between the transistors 10 and 12 is relatively high since a potential approaching ground is produced at such times on the collector of the transistor 10 to indicate large flows of current through the transistor. Furthermore, a negative potential is introduced to the base of the transistor 10 from the collector of the transistor 12 during such times. This potential corresponds to the potential introduced to the base of the transistor 12 so as to balance the effects of the latter potential. Because of this balancing effect, the negative potential introduced through the resistance 40 to the base of the transistor 12 is not immediately effective in making the transistor conductive.

As described previously, the voltage difference between the collectors of the transistors 10 and 12 gradually decreases because of the flow of current through the inductance 20. This causes the voltage on the collector of the transistor 10 to become negative. When the voltage on the collector of the transistor 10 becomes sufficiently negative, the negative potential introduced to the base of the transistor 12 through the resistance 40 becomes predominant. This causes a flow of current to be initiated through the transistor 12. Once the flow of current through the transistor 12 is initiated, the transistor 12 becomes fully conductive. This causes a ground potential to be produced on the collector of the transistor 12. This potential is introduced to the emitter of the transistor 10 to make the transistor non-conductive.

In this way, the circuit shown in Figure 3 changes from a first state of operation to a second state of operation upon the introduction of a triggering signal. After a delayed period of time, the circuit automatically changes from the second state of operation back to the first state of operation. The delay is dependent upon the values of certain parameters such as the inductance 20, the resistances 14 and 18 and the resistances 30 and 40.

There are thus provided electrical circuits for performing various types of functions similar to those performed by multivibrators. All of the circuits include a pair of transistors directly coupled to each other and also include a reactance member such as an inductance connected between the collectors of the transistors. By connecting the inductance directly between the collectors of the transistors or by including a small resistance in series with the inductance, a free running multivibrator is obtained for producing clock signals. When a resistance having an intermediate value is connected in series with the inductance, a bistable multivibrator is obtained for producing an output signal instantaneously after the introduction of an input signal. Further modifications cause a monostable multivibrator to be produced.

All of the circuits have the advantages of low power losses resulting from the direct coupling of the transistors and from the use of an inductance as a control member. Further advantages include low impedances in the stages and low space requirements. In addition, standard packages on panel boards can be built because of the possibility of forming different types of multivibrators by relatively small but important modifications. This tends to minimize costs.

We claim:

1. In combination, a first semi-conductor having a base, an emitter and a collector, a second semi-conductor having a base, an emitter and a collector, means for providing a reference potential, the emitters of the first and second semi-conductors being connected to the reference potential, the collectors in each of the first and second semi-conductors being directly connected to the base of the other semi-conductor to obtain the conductivity of only one of the first and second semi-conductors at each instant, first and second resistance means connected to a source of direct voltage and respectively connected to the collectors of the first and second semi-conductors for applying voltages to the collectors of the first and second semi-conductors, and means for controlling the time for the first semi-conductor to change from a conductive to a non-conductive state and for the second semi-conductor to change from a non-conductive to a conductive state and including a saturable inductance connected between the collectors of the first and second semi-conductors.

2. In combination, a first semi-conductor having a base, an emitter and collector, a second semi-conductor having a base, an emitter and a collector, means for providing a reference potential, the emitters of the first and second semi-conductors being connected to the reference potential, a source of direct voltage, a first resistance connected between the source of direct voltage and the collector of the first semi-conductor, a second resistance connected between the source of direct voltage and the collector of the second semi-conductor, a saturable inductance connected between the collectors of the first and second semi-conductors, and means for controlling the conductivity of the second semi-conductor in accordance with the potential produced on the collector of the first semi-conductor and for obtaining the conductivity of only one of the semi-conductors at each instant and including a direct connection between the collector of the first semi-conductor and the base of the second semi-conductor.

3. The combination set forth in claim 2 in which the collector of the second semi-conductor is directly connected to the base of the first semi-conductor.

4. The combination set forth in claim 2 in which the collector of the second semi-conductor is directly connected to the base of the first semi-conductor, and in which a third resistance is in series with the inductance between the collectors of the first and second semi-conductors.

5. The combination set forth in claim 2 in which a third resistance is connected between the source of direct voltage and the base of the first semi-conductor, and in which the base of the first semi-conductor is connected to receive input signals.

6. The combination set forth in claim 2 in which a third resistance is in series with the inductance between the collectors of the first and second semi-conductors and in which a fourth resistance is connected between the source of direct voltage and the base of the first semi-conductor and in which the base of the first semi-conductor is connected to receive input signals.

7. In combination, first and second semi-conductors each having a base electrode, an emitter electrode and a collector electrode, means for providing a reference potential, the emitter electrodes of the first and second semi-conductors being connected to the reference potential, the base electrode of each of the first and second semi-conductors and the collector electrode of the other of the first and second semi-conductors being directly connected to each other to provide for a flow of current through only one of the semi-conductors at any one time, means for providing a direct voltage, means for controlling the voltage on the collectors and the bases of the first and second semi-conductors in accordance with the flow of current through the semi-conductors and including a pair of resistances each connected between the voltage means and the collector electrode of a different one of the first and second semi-conductors, and means for providing a variation in the voltage introduced to the pairs of the first and second semi-conductors for a change in the states of conductivity of the semi-conductors after a controlled period of time dependent upon the characteristics of such means, said last mentioned means including a saturable inductance connected between the collector electrodes of the first and second semi-conductors.

8. In combination, first and second semi-conductors each having a base electrode, a collector electrode and an emitter electrode, means for providing a reference potential, the emitter electrodes of the first and second semi-conductors being connected to the reference potential, means for providing for a flow of current through only one of the first and second semi-conductors at each instant and including direct connections between the collector electrode of each semi-conductor and the base electrode of the other semi-conductor, means for providing a direct voltage, means for controlling the voltage introduced to the base of each semi-conductor in accordance with the flow of current through the other semi-conductor and including first and second resistances each connected between the voltage means and the collector electrode of a different one of the first and second semi-conductors, and means for providing for variations in the voltage introduced to the bases of the semi-conductors for a change in the states of conductivity of the semi-conductors after a particular period of time dependent upon the characteristics of such means and including a saturable inductance coupled electrically at one end to the common terminal between the first resistance and the collector of the first semi-conductor and coupled electrically at the other end to the common terminal between the second resistance and the collector of the second semi-conductor.

9. In combination, a first semi-conductor having a collector, a base and an emitter, a second semi-conductor having a collector, a base and an emitter, means for providing a reference potential, the emitters of the first and second semi-conductors being connected to the reference potential, means for providing for a flow of current through only one of the semi-conductors at each instant and including a direct connection between the collector of the first semi-conductor and the base of the second semi-conductor, means for controlling the voltage introduced to the collector of the first semi-conductor in accordance with the flow of current through the first semi-conductor and including a first resistance connected between the voltage source and the collector of the first semi-conductor, means for controlling the voltage introduced to the collector of the second semi-conductor in accordance with the flow of current through the semi-conductor and including a second resistance connected between the voltage source and the collector of the second semi-conductor, and means for providing a variable impedance upon a continued flow of current through such means to provide a control over the potentials introduced to the collectors of the first and second semi-conductors and including a saturable inductance connected between the collectors of the first and second semi-conductors.

10. The combination as set forth in claim 9 in which means are included for providing for changes in the states of operation of the first and second semi-conductors immediately upon the introduction of an input signal and including a third resistance connected in series with the inductance between the collectors of the first and second semi-conductors.

11. The combination set forth in claim 9 including a direct connection between the collector of the second semi-conductor and the base of the first semi-conductor.

12. In combination, a first semi-conductor having a collector, a base and an emitter, a second semi-conductor having a collector, a base and an emitter, means for providing a reference potential, the emitters of the first and second semi-conductors being connected to the reference potential, means for producing a flow of current through the second semi-conductor upon the triggering of the first semi-conductor into a state of non-conductivity and comprising a direct connection between the collector of the first semi-conductor and the base of the second semi-conductor, a source of direct voltage, means for controlling the voltage introduced to the collector of the first semi-conductor in accordance with the flow of current through the first semi-conductor and including a first resistance connected between the voltage source and the collector of the first semi-conductor, means for controlling the voltage introduced to the collector of the second semi-conductor in accordance with the flow of current through the second semi-conductor and including a second resistance connected between the voltage source and the collector of the second semi-conductor, means for providing a variable impedance upon a continued flow of current through such means for a control over the potentials applied to the collectors and bases of the first and second semi-conductors and comprising a saturable inductance and a third resistance connected between the collectors of the first and second semi-conductors, fourth resistance means connected between the source of direct voltage and the base of the first semi-conductor, and means for applying a triggering signal to the base of the first semi-conductor for a change in the state of the first semi-conductor from a conductive state to a non-conductive state and back to a conductive state a particular period of time after the introduction of such triggering signal and in accordance with the values of the inductance and the different resistances.

References Cited in the file of this patent

UNITED STATES PATENTS

| | | |
|---|---|---|
| 2,759,104 | Skellett | Aug. 14, 1956 |
| 2,812,437 | Sziklai | Nov. 5, 1957 |

OTHER REFERENCES

Article, "Directly Coupled Transistor Circuits," by Beter et al.; Electronics, June 1955.